US007657874B2

United States Patent
Lidin et al.

(10) Patent No.: US 7,657,874 B2
(45) Date of Patent: Feb. 2, 2010

(54) PATTERN TYPES AS CONSTRAINTS ON GENERIC TYPE PARAMETERS

(75) Inventors: Sergey Lidin, Issaquah, WA (US); Henricus Johannes Maria Meijer, Mercer Island, WA (US)

(73) Assignee: Microsoft Corporation, Redmond, WA (US)

( * ) Notice: Subject to any disclaimer, the term of this patent is extended or adjusted under 35 U.S.C. 154(b) by 667 days.

(21) Appl. No.: 10/924,544

(22) Filed: Aug. 24, 2004

(65) Prior Publication Data

US 2006/0048024 A1    Mar. 2, 2006

(51) Int. Cl.
G06F 9/44 (2006.01)
G01R 31/28 (2006.01)
(52) U.S. Cl. .................... 717/126; 717/114; 714/724
(58) Field of Classification Search ......... 717/106–119, 717/162–165
See application file for complete search history.

(56) References Cited

U.S. PATENT DOCUMENTS

| | | | |
|---|---|---|---|
| 5,983,020 A | 11/1999 | Sweeney et al. | |
| 6,014,518 A | 1/2000 | Steensgaard | |
| 6,230,314 B1 | 5/2001 | Sweeney et al. | |
| 6,381,736 B1 * | 4/2002 | Klotz et al. | 717/114 |
| 6,918,107 B2 * | 7/2005 | Lucas et al. | 717/124 |
| 7,086,041 B2 * | 8/2006 | Plesko et al. | 717/141 |
| 7,284,242 B2 * | 10/2007 | Vion-Dury | 717/159 |
| 2002/0112098 A1 * | 8/2002 | Halstead et al. | 709/332 |
| 2003/0188295 A1 * | 10/2003 | Adl-Tabatabai et al. | 717/126 |

OTHER PUBLICATIONS

Rowan Davies and Frank Pfenning, Intersection Types and Computational Effects, Year of Publication 2000, ACM, pp. 198-208.*
Ping Gao and Robert Esser, Polymorphic CSP Type Checking, Year of Publication 2001, IEEE Computer Society, pp. 156-162.*
R. Rodosek, M.G. Wallace, and T. Hajian. A New Approach to Integrate Mixed Integer Programming. CP96 Workshop on Constraint Programming Applications: An Inventory and Taxonomy, 1996. 10 pages.
V. Choppella and C.T. Haynes. Diagnosis of Ill-typed Programs. Technical Report 426, Indiana University, 1995. 10 pages.
B. Demoen, M. Garcia De La Banda, and P.J. Stuckey. Type Constraint Solving for Parametric and Ad-hoc Polymorphism. In Proc. of the 22nd Australian Computer Science Conference, pp. 217-228, 1999.
V. Simonet. An Extension of HM(X) with Bounded Existential and Universal Data-types. Proceedings of the eighth ACM SIGPLAN International Conference on Functional Programming, pp. 39-50, 2003.

* cited by examiner

Primary Examiner—Michael J Yigdall
Assistant Examiner—Hanh T Bui
(74) Attorney, Agent, or Firm—Workman Nydegger

(57) ABSTRACT

A system and method for constraining generic types is disclosed. In brief, the subject invention provides a pattern type for defining a set of one or more parameter constraints. Rather than being confined to a predetermined set of hard-coded constraints in an execution engine, a pattern type can be specified as an extensible constraint mechanism for generic type parameters. According to one aspect of the invention, the pattern type can manifest itself as a class including one or more properties and/or features. The shape of the pattern type can then be compared or matched to instantiated type parameters to determine constraint satisfaction.

27 Claims, 9 Drawing Sheets

PATTERN TYPES AS CONSTRAINTS ON GENERIC TYPE PARAMETERS

TECHNICAL FIELD

The present invention relates generally to computers and more particularly toward a constraint mechanism for generic type parameters.

BACKGROUND

Generic types form a powerful and ubiquitous aspect of object-oriented programming. Generic types, also known as parameterized types, define formal constructs of some type(s) (e.g., a list with elements of some type, a queue with elements of some type, a stack with elements of some type . . . ). This "some type(s)" is referred to in the art as the parameter(s) of generic types. A common notation for generic types is List<T>, where T represents the type parameter and List is the generic type. When a concrete type is used as a type parameter of a generic type, the resulting type is commonly referred to as generic instantiation or constructed type (e.g., a stack of integer values Stack<int>, list of strings List<string>, queue of floating-point values Queue<float> . . . ).

In many cases, the set of types that can be used for instantiation of a given generic type needs to be restricted. For instance, to be used for instantiation of a sorted list, SortedList<T>, instances of the type parameter T must be comparable to other instances of T, otherwise sorting would be impossible. In other words, type T should implement interface IComparable<T>, for example, which exposes a compare function—in C# notation: SortedList<T> where T: IComparable<T>. Another common constraint is to restrict type parameters to types that have a default constructor—in C# notation: Dictionary<K, V> where K: IComparable<K> where V: New( ). Such limitations on type parameters are called constraints.

Different execution environments (e.g., Common Language Runtime (CLR), Java Runtime Environment (JRE) . . . ) employ disparate means to specify the constraints and different sets of possible constraints, however they all implement a set of possible constraints that is predefined and built into the execution environment (i.e., hard coded). For example, the CLR implementation of generics permits a demand that a generic type parameter be derived from a certain type (e.g., extension constraint), implements certain interface(s) (e.g., implementation constraint), has a default constructor (e.g., constructor constraint) and is a reference type or value type. These constraints are represented in metadata via spare bits in two generic parameter tables.

Predefined constraints of these kinds can be utilized in certain combinations or not at all, but there is no possibility of introducing a new kind or type of constraint without redesigning and/or rebuilding the execution environment/infrastructure. In particular, additional space must be allocated (if even available) to express new constraints and a completely new support infrastructure must be built to enable the engine to make decisions regarding each new constraint. Stated differently, conventional constraints are hard-wired into the execution environment resulting in a non-extensible system. This leads to problems ranging from inconvenience when it is cumbersome but possible to express a new kind of constraint through a combination of existing constraints, to language inadequacy, when it is not possible to express a particular new constraint.

Accordingly, there is a need in the art for a system and method of constraining generic type parameters that is simple and efficient as well as easily extensible. More specifically, there is a need for a mechanism that does not require rebuilding an associated engine/infrastructure when adding new forms of constraints.

SUMMARY

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

Briefly described, the present invention concerns a simple and extensible constraint mechanism for generic type parameters that does not require rebuilding and/or redesign of an execution environment, among other things. In particular, the subject invention introduces pattern types that can be employed to define a set of one or more constraints on generic type parameters or more specifically instantiated (and/or declared) types associated therewith. Pattern type matching or comparison can subsequently be utilized to type check constructed types to ensure that the instantiated types satisfy the constraints specified by one or more pattern types. If the constraints are not satisfied then a compile-time error can be generated, rather than a run-time error, to facilitate generation of reliable and trustworthy software.

According to one aspect of the invention, a generic type component can be specified to link pattern types to associated type parameters. The generic type declaration can include a name or constructed type to identify the generic type, one or more type parameters that act as placeholders for instantiation types, a pattern type identifier that identifies particular pattern type(s) associated with the type parameter(s), as well as keyword(s) or phrases that specify the relationship between one or more pattern types and the instantiation type(s) that can employed during and aid in type checking.

In accordance with another aspect of the invention, the pattern type(s) and the instantiation type(s) can be specified as programmatic classes or any other type or structure supported by a language type system (e.g., interface, struct, delegate . . . ). Therefore, a pattern type class, for instance, can simply be matched or compared with an instantiation type class to determine constraint satisfaction. In particular, the pattern type can include various properties (e.g., implements particular interfaces) and/or features (e.g., default constructor, copy constructor . . . ) that can be matched to properties and/or features of the instantiated type.

According to yet another aspect of the invention, comparisons between instantiation types and pattern types can take many forms. For instance, comparisons can pertain to similarities between the pattern and type. In other words, the type includes at least the properties and/or features of the pattern type. Additionally or alternatively, comparisons can concern dissimilarities between the type and the pattern. For example, the type does not include any of the properties and/or features of the pattern type. Furthermore, there can be a combination of comparisons utilizing both similarities and dissimilarities of one or more pattern types. Still further yet, it is to be appreciated that several pattern types can be employed together in mathematical relation to one another to constrain types, such as a union and/or intersection of pluralities of pattern types.

According to another aspect of the invention, a type checker can be employed to verify that relationships between instantiation types and one or more pattern types, as specified, are satisfied. If the constraints are not satisfied then a compile-time error can be generated.

According to another aspect of the invention, modification of constraints is easily accomplished without redesigning and/or rebuilding an execution engine by simply amending pattern types (e.g., alter, add, delete). Rather than providing a fixed hard coded set of parameter constraints, an interface can be provided to enable programmers to easily access pattern types in a type definition system and make customized changes to one or more pattern types defining constraints on one or more generic type parameters.

To the accomplishment of the foregoing and related ends, certain illustrative aspects of the invention are described herein in connection with the following description and the annexed drawings. These aspects are indicative of various ways in which the invention may be practiced, all of which are intended to be covered by the present invention. Other advantages and novel features of the invention may become apparent from the following detailed description of the invention when considered in conjunction with the drawings.

BRIEF DESCRIPTION OF THE DRAWINGS

The foregoing and other aspects of the invention will become apparent from the following detailed description and the appended drawings described in brief hereinafter.

DETAILED DESCRIPTION

The present invention is now described with reference to the annexed drawings, wherein like numerals refer to like elements throughout. It should be understood, however, that the drawings and detailed description thereto are not intended to limit the invention to the particular form disclosed. Rather, the intention is to cover all modifications, equivalents, and alternatives falling within the spirit and scope of the present invention.

As used in this application, the terms "component" and "system" are intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

Furthermore, the present invention may be implemented as a method, apparatus, or article of manufacture using standard programming and/or engineering techniques to produce software, firmware, hardware, or any combination thereof to control a computer to implement the disclosed invention. The term "article of manufacture" (or alternatively, "computer program product") as used herein is intended to encompass a computer program accessible from any computer-readable device, carrier, or media. For example, computer readable media can include but is not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the subject invention.

Figure 1:
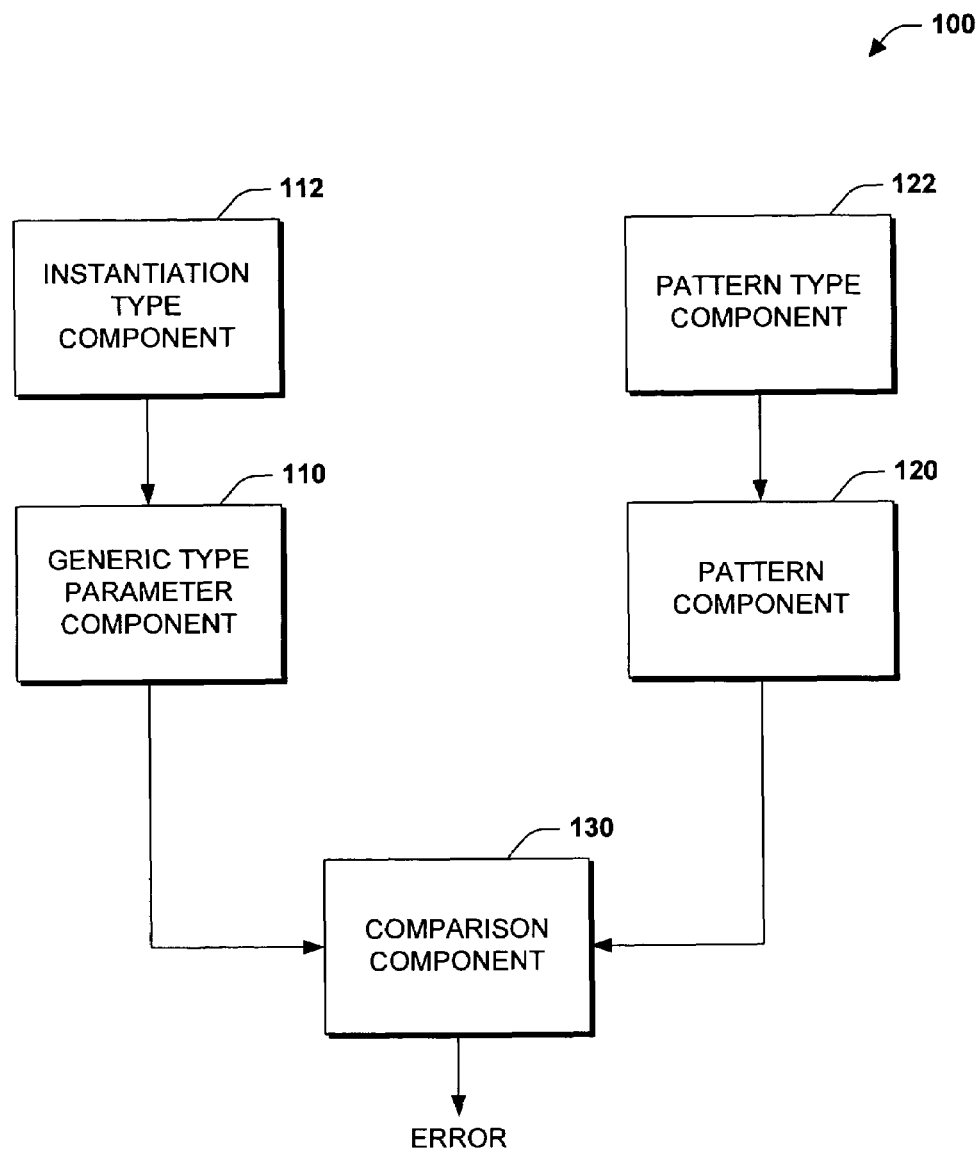
FIG. 1 is a schematic block diagram of a generic type parameter constraint system in accordance with an aspect of the subject invention.

Turning initially to FIG. 1, a generic type parameter constraint system 100 is illustrated in accordance with an aspect of the subject invention. Constraint system 100 includes a generic type parameter component 110, a pattern component 120, and a comparison component 130. Generic type parameter component 110 is adapted to receive a generic type parameter type argument or an instantiation type 112 (also referred to herein as instantiation type component, type component, or instantiation parameter type component) associated therewith. A type or class is a set of data with associated methods. For example, integer and string are types. So essentially, types have a field that contains a value and associated methods. For instance, methods can correspond to parsing a string, casting a string into a value, converting a value into a string, adding one value to another, and the like. Generic types are types that are parameterized by other types or type constructors. In other words, generic types are general structures that are capable of being specified without committing to an actual data type. For instance, a generic type can be an array of types or a queue of types, where the type is integer or some other more advanced object. So, an array of types can be specified as Array <T>, wherein brackets enclose the generic parameter T. The generic type can then be instantiated with closed types such as an array of integers, an array of floats, etc. In essence, generic types provide an additional level of indirection that is both very powerful and advantageous.

However, the level of genericism of generic types cannot always be unrestrained. For example, a compiler can compile generic code independent of specific types that can be subsequently instantiated and utilized for a particular task. As a result, a programmer may attempt to parameterize classes, structs, interfaces, delegates, and/or methods with incompatible types. This would result in a runtime error, which is simply not acceptable where a safe and reliable computer experience is desired. Thus, constraints can be employed to rein in some of the generalization and ensure strong type safety. By way of example, assume we have a sorted array, SortedArray<T>, which is a sequence of ($T_1, T_2, T_3 \ldots T_n$)

where $T_{n-1}$ is minor to $T_n$ and $T_n$ is major to $T_{n-1}$. Accordingly, there must be a means to compare instances of T. In this case, T has a constraint. Specifically, T must implement a compare function (e.g., implement interface IComparable). In other words, T must be a type that capable of being compared with another type. This is the essence of a generic parameter constraint.

Conventionally, as mentioned in the background, constraints are predefined or hard coded into an execution environment thereby limiting the number and types of constraints that can be employed without extending and rebuilding the execution engine, if even possible. Constraints are represented or encoded by (bit) flags in metadata. Accordingly, the flags can be extended only so far before one runs out of space to express additional constraints. Moreover, every time the flags are extended the whole engine needs to be rebuilt not just recompiled. Accordingly, bit flags are not the only thing involved with extending an engine. There must be supporting infrastructure that analyzes the new flags and makes decisions based thereon. In particular, procedures must be provided to determine when, if, and how a new constraint is satisfied. According to an aspect of the invention, a pattern type or class can be employed as a constraint to solve this problem.

Pattern component 120 is adapted to receive/retrieve one or more pattern types 122 (also referred to herein as pattern type components or simply patterns) and pass them to the comparison component 130. A pattern type 122 can simply be a programmatic class whose shape identifies particular constraints to be satisfied. Similarly, an instantiation type 112 can be a programmatic class defining a type that is utilized to generate a constructed type from a generic type. Upon receipt of an instantiation type 112 and a pattern type 122 from generic type parameter component 110 and pattern component 120 respectively, comparison component 130 can compare the instantiation type 112 to the pattern type 122 to determine if the constraints defined by the pattern type 122 are satisfied. If the constraints are not satisfied, a compile time error can be generated.

Figure 2:
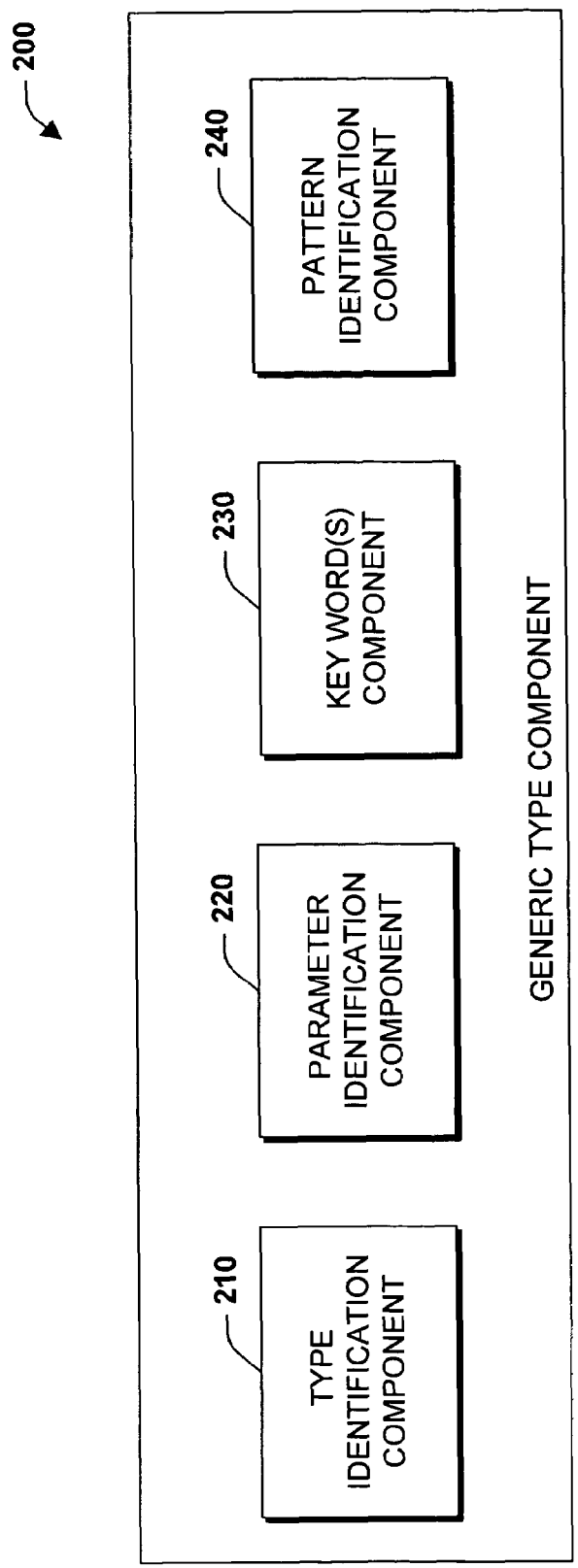
FIG. 2 is a schematic block diagram of a generic type component in accordance with an aspect of the subject invention.

FIG. 2 illustrates a generic type component 200 in accordance with an aspect of the subject invention. Generic type component 200 provides a mechanism for generic type specification or declaration. Generic type component 200 (also referred to herein as generic type declaration) can include, inter alia, type identification component 210, parameter identification component 220, keyword(s) component 230, and pattern identification component 240. Type identification component provides the name or constructed type associated with a defined generic type (e.g., SortedArray). Associated with the type identification component 210 is parameter identification component. The parameter identification component can identify one or more generic parameters utilizing delimiters including but not limited to angular brackets (e.g., < >). Furthermore, a single letter can be utilized as a placeholder for an instantiation type that will be assigned (e.g., <T>) although the invention also contemplates utilization of a plurality of alphanumerical characters and/or phrases. Keyword(s) component 230 introduces constraints on one or more type parameters specified by parameter identification component 220. Furthermore, in the subject invention, keyword(s) component 230 also identifies the type of comparison that will be utilized to determine whether constraints are satisfied. According to an aspect of the invention, those keywords can include but are not limited to, "where <type parameter> is like," "where <type parameter> is similar to," "where <type parameter> is unlike," "where <type parameter> is dissimilar to," and "where type parameter is not similar to," where type parameter is the parameter identified by parameter identification component 220. The pattern type(s) are uniquely identified by pattern identification component 240. Furthermore, the identified pattern types are linked to a specific parameter type(s) in a particular manner by the key word(s) component 230. By way of example, consider the following specified generic type component:

```
SortedArray<T> where T is like U {
...
}
```

Here, the type identifier is SortedArray, the parameter identifier is T, the keyword(s) are "where T is like," and the pattern identifier is U. Following this declaration can be a series of one or more variable declarations and programmatic statements. Thus, it can be said that the generic type parameter T is constrained by pattern type U.

It should be appreciated that the instantiation type that will be substituted for the parameter type identified by the parameter identification component 220 as well as the pattern type component identified by the pattern identification component 240 can be defined as programmatic classes in accordance with an aspect of the invention. Turning briefly back to FIG. 1, this means that the comparison component 130 can simply match or compare two classes to determine whether constraints are satisfied. This is much simpler than conventional type constraint implementations, which must perform multiple checks on a plurality of constraints rather than simply checking if a type follows a pattern as is contemplated by the subject invention.

Figure 3:
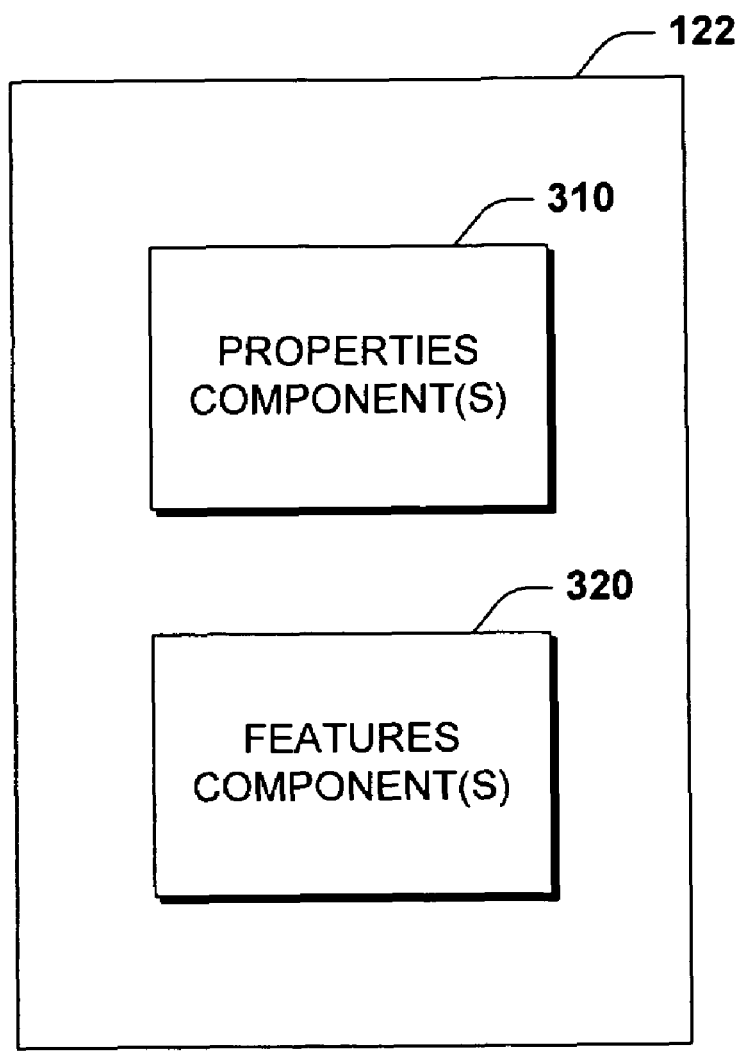
FIG. 3 is a schematic block diagram of a pattern component in accordance with an aspect of the subject invention.

FIG. 3 depicts a pattern type component 122 in accordance with an aspect of the invention. Pattern type component 122 is received/retrieved by pattern component 120 (FIG. 1). Pattern type component 122 includes zero or more property components 310 and zero or more feature components 320. Both property component 310 and feature component 320 provide constraints for a generic type. In others words, the components 310 and 320 provide an indication of the properties and/or features that a generic type must include and/or exclude in order to satisfy the pattern. In accordance with an aspect of the invention, pattern type component 122 can be a class. Classes are utilized to instantiate objects in memory as well as describe both the properties and behavior thereof. Here, the class can be used to define a type, namely a pattern type. It should also be appreciated and noted, however, that pattern types can be defined by any programmatic type or structure supported by a language type system (e.g., class, interface, delegate, struct . . . ). The pattern type component 122 can have two components a property component 310 and a feature component 320; however, it should be appreciated that such properties and features can reside in a single component. Here, property component 310 identifies particular properties of the pattern type. For example, the pattern type must be derived from another class or implement an interface such as IComparable. Feature component 320 identifies particular features, for example, constructors that a type should include, such as a default constructor or a copy constructor to name but a few. Consider the following example of a pattern type component 122:

```
Class P : U,IT {      //properties
    P() { ... };      //features
```

```
        P(P){ ... };
}
```

Here, the pattern class P is derived from U and implements IT (properties). Furthermore, P includes a default constructor (i.e., P( )) as well as a copy constructor (i.e., P(P)) (features).

An instantiation type can be similar to the pattern type component 122 in form. Specifically, it can include one or more properties and/or one or more features. Accordingly, it should appreciated that almost all, if not all, type constraints can be specified in pattern type component class, for instance as one or more specific properties and/or features.

Returning to FIG. 1, comparison component 130 receives or retrieves instantiation type components 112 and at least one pattern type component 122 from generic type parameter component 110 and pattern component 120, respectively, and determines whether the type conforms to the one or more pattern components. Conformity can be assessed by the comparison component 130 in accordance with similarity and/or dissimilarity of the type component to the pattern component. For instance, the type component contains at least the constraints indicated by the pattern component or the type component does not include any of the constraints specified by the pattern. Furthermore, conformance can be measured with respect to inclusion of constraints by one pattern component and exclusion of limitations described by another pattern component. According to an aspect of the invention, both the instantiation type component 112 and the pattern type component 122 can be represented by classes. Accordingly, consider the following three exemplary classes defining types:

```
Class A : U, IT {
    A() { ... };
}
Class B : U, IT, IU {
    B() { ... };
    f() { ... };
}
Class C : U, IC {
    C(C) { ... }
}
```

By way of example, assume that class A defines the pattern type component 122 and class B defines the instantiation type component 112. Further, assume that comparison component 130 is merely implementing a simple test for inclusion for purposes of clarity and understanding. Therefore, the comparison component 130 would need to determine whether class B, the generic type instantiation, is the same or similar to class A, the pattern type. Stated differently, the comparison component 130 will determine whether the class B includes at least the properties and features of class A. Here, the pattern type, class A, is derived from class U and implements interface IT. Furthermore, class A includes a default constructor. The generic type instantiation, class B, is derived from class U and implements interfaces IT and IU. Additionally, class B, includes a default constructor and a method f( ). Thus, class B defines a compatible or acceptable type as it includes all the constraints defined by the pattern type, class A. In particular, class B is derived from U, implements interface IT and includes a default constructor. The fact that class B also implements the interface IU and has an additional method declaration is of no consequence in this example, as the comparison component is simply checking to ensure that the generic type component 110 includes at least the constraints of the pattern type component 122.

Now consider the scenario in which class C defines the type employed to instantiate a generic type 112 and class A still represents the pattern type 122. Here, class C derives from class U and implements interface IC. Further, class C includes a copy constructor. In this case, comparison component 130 would generate an error signal utilized to produce a compile-time error as class C does not include all the constraints described by the pattern type, class A. Specifically, class C does not implement the interface IT and does not include a default constructor.

It should also be appreciated that a plurality of pattern type components 122 can be associated with one or more instantiation type components 112 rather than simply a one to one mapping. Accordingly, comparison component 130 can receive and correctly evaluate this scenario. For example, a union of a plurality of pattern types 122 can be specified as the constraint on an instantiation type 112 such that the type must include at least the constraints as specified by all pattern types. Additionally or alternatively, a type constraint can be specified as the intersection of a plurality of pattern types such as A and B. Accordingly, an instantiation type 112 is satisfactory only if it includes at least the constraints in common with both pattern A and pattern B. It should further be appreciated that the comparison component 130 can provide support for a myriad of different comparisons including multiple types, multiple pattern type components, and a plurality of different relationships therebetween (e.g., similar, dissimilar . . . ).

Figure 4:
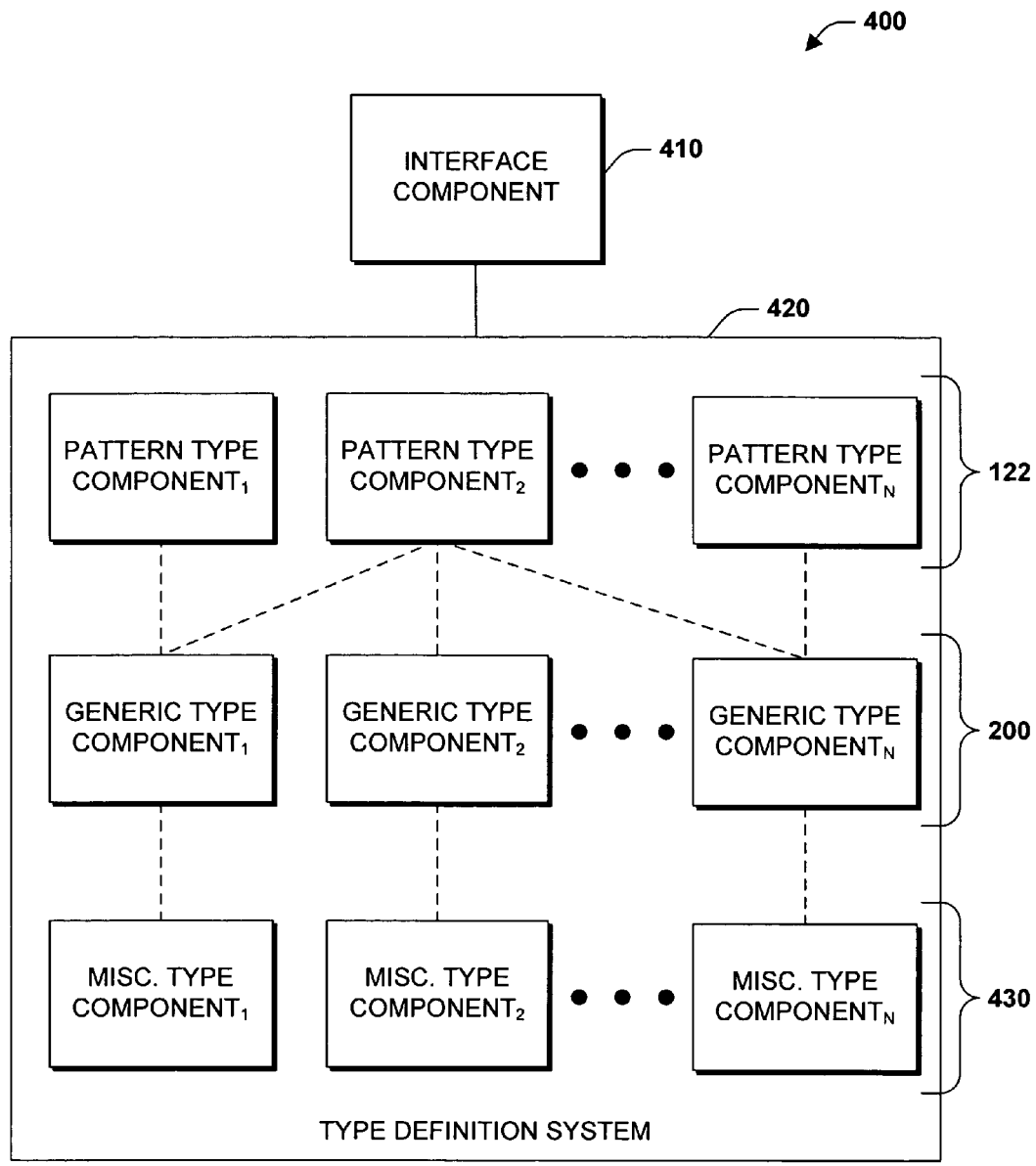
FIG. 4 is a schematic block diagram of a constraint modification system in accordance with an aspect of the subject invention.

FIG. 4 illustrates a constraint modification system 400 in accordance with an aspect of the subject invention. System 400 facilitates adding, deleting, or otherwise modifying generic type parameter constraints without redesigning and rebuilding the execution engine. System 400 includes a type definition system 420 and an interface component 410. Type definition system 420 includes a plurality of generic type components 200 (GENERIC TYPE COMPONENT$_1$-GENERIC TYPE COMPONENT$_N$, where N is an integer greater than or equal to 1), pattern type components 122 (PATTERN TYPE COMPONENT$_1$-PATTERN TYPE COMPONENT$_N$, where N is an integer greater than or equal to 1), and miscellaneous type components 430 (MISC. TYPE COMPONENT$_1$-MISC. TYPE COMPONENT$_N$, where N is an integer greater than or equal to 1). Generic type components 220 reference directly or indirectly one or more components 430 (e.g., user defined or system defined) utilized to instantiate a generic type parameters and one or more pattern type components 122 to define generic type parameter constraints. Interface component 410 provides access to the type definition system 420. Accordingly, programmers can utilize interface component 410 to modify existing pattern type components 122, add new pattern type components 122, delete pattern type components 122, and/or any combination thereof. In contrast to conventional generic type systems, the present invention does not require an execution engine to be redesigned and rebuilt if a generic type parameter constraint needs to be added, modified, or changes at least because the constraints are not hard coded into the execution engine.

Figure 5:
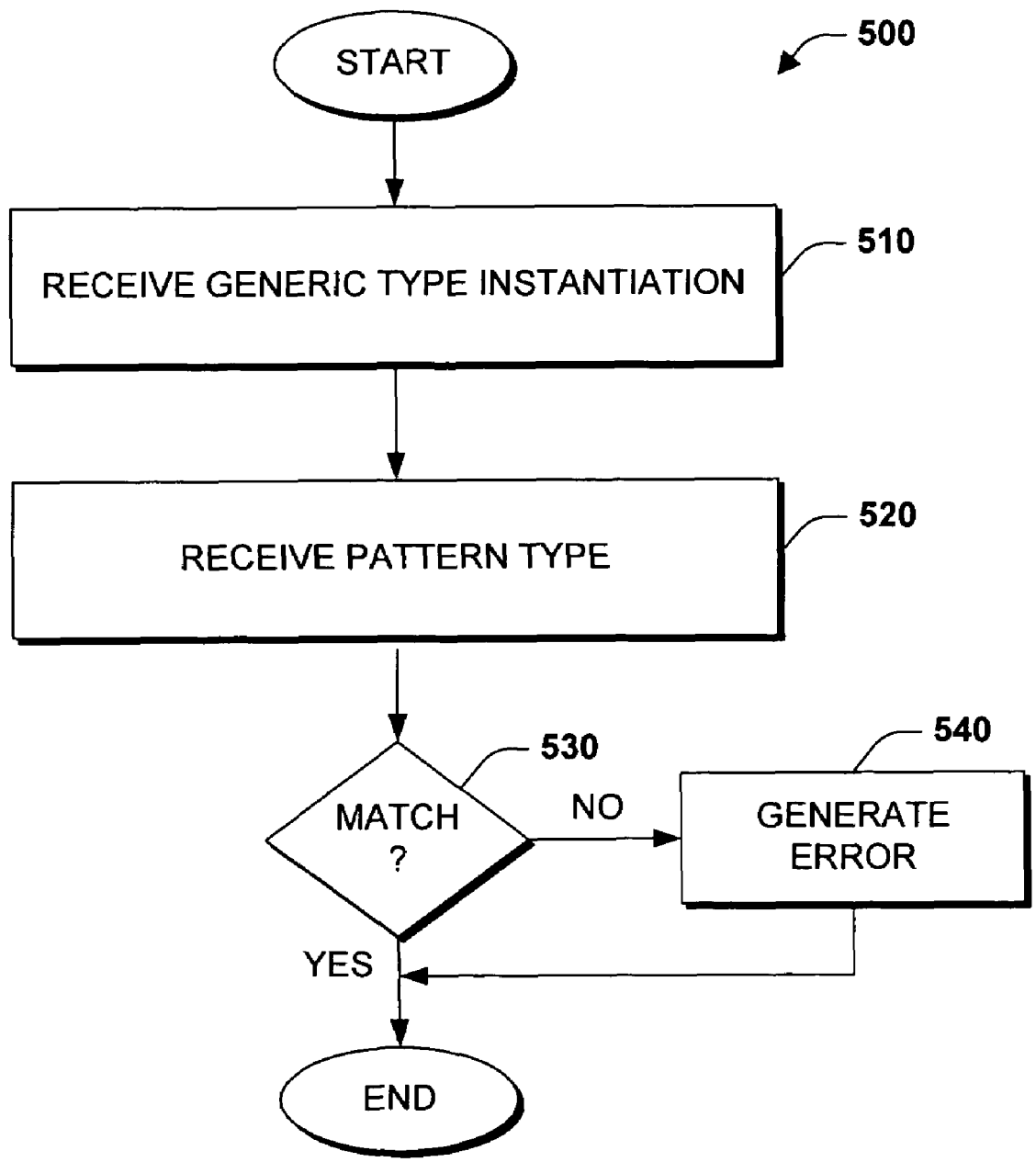
FIG. 5 is a flow chart diagram of a type checking methodology in accordance with an aspect of the subject invention.
Figure 6:
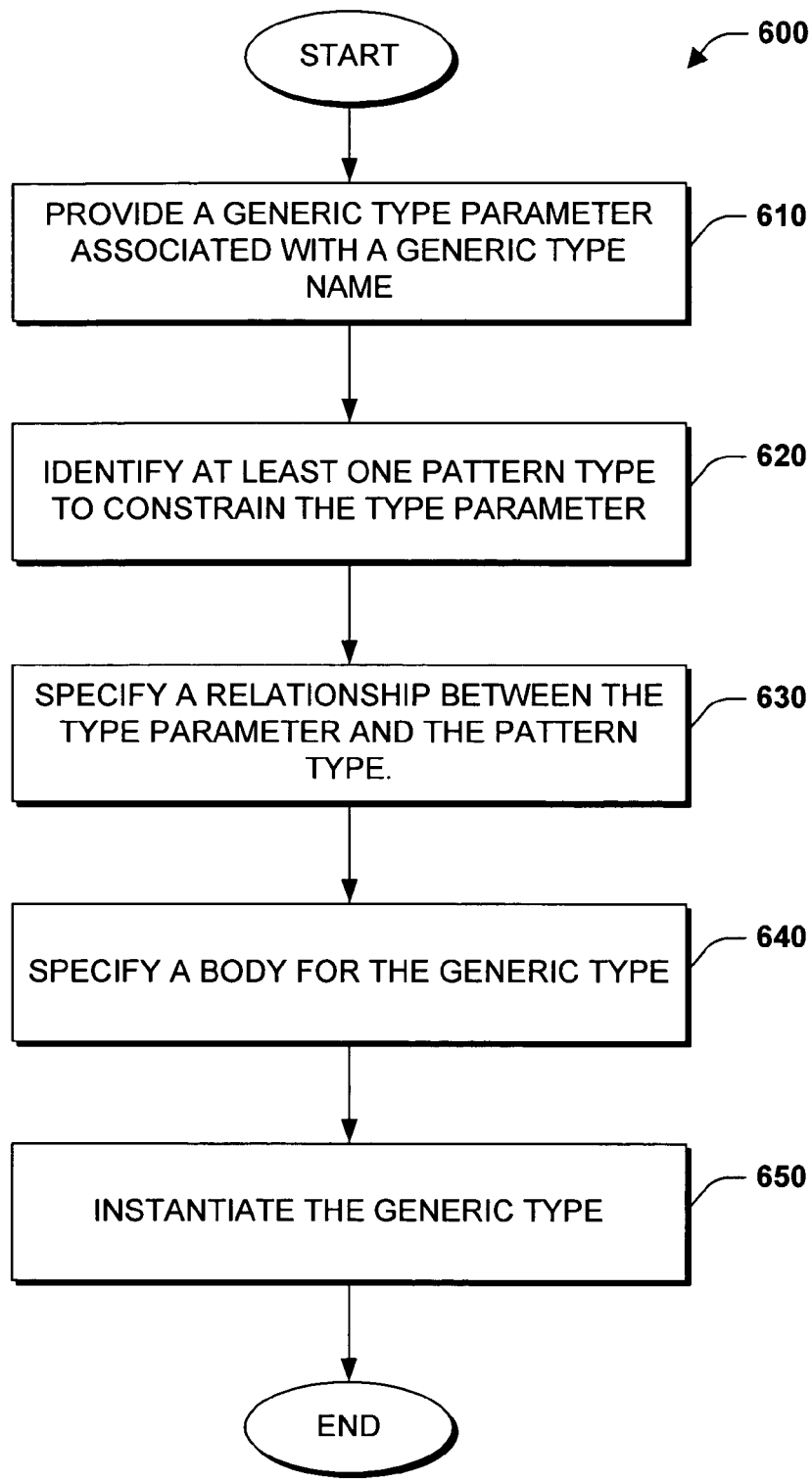
FIG. 6 is a flow chart diagram of a method of programming a computer utilizing generic types in accordance with an aspect of the subject invention.
Figure 7:
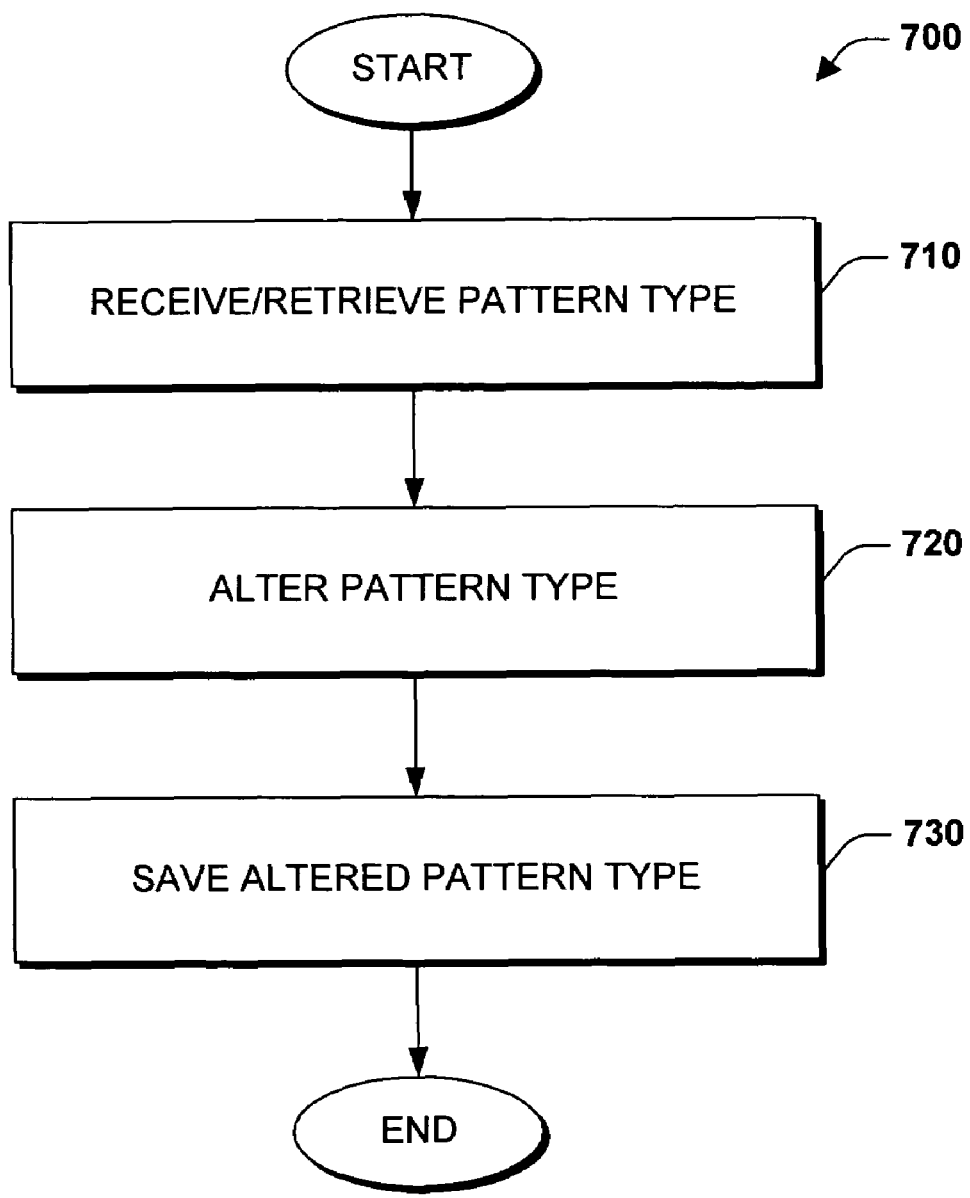
FIG. 7 is a flow chart diagram of a method of interacting with generic types in accordance with an aspect of the subject invention.

In view of the exemplary systems described supra, a methodology that may be implemented in accordance with the present invention will be better appreciated with reference to the flow charts of FIGS. 5-7. While for purposes of simplicity of explanation, the methodology is shown and described as a series of blocks, it is to be understood and appreciated that the present invention is not limited by the order of the blocks, as some blocks may, in accordance with the present invention, occur in different orders and/or concurrently with other blocks from what is depicted and described herein. Moreover, not all illustrated blocks may be required to implement the methodology in accordance with the present invention.

Additionally, it should be further appreciated that the methodologies disclosed hereinafter and throughout this specification are capable of being stored on an article of manufacture to facilitate transporting and transferring such methodologies to computers for execution. The term article of manufacture, as used, is intended to encompass a computer program accessible from any computer-readable device, carrier, or media.

Turning to FIG. 5, a method 500 of type checking generic types is illustrated in accordance with an aspect of the subject invention. At 510, an instantiation type is received, which is a type argument utilized to produce a constructed type. For example, assume the generic type SortedArray<T>, the instantiation type could be F, where F replaces the placeholder T in the generic type expression (SortedArray<F>). The instantiation type F, of course, can have a plurality of properties (e.g., derived from U, implements IT . . . ) and/or features (e.g., default constructor, copy constructor . . . ). At 520, a pattern type is received that is associated with the generic type and thus the instantiation type. Subsequently, a determination is made as to whether the pattern type and the instantiation type match, at 530. For example, the type can match the pattern type if they are similar or the type contains at least the properties and/or features of the pattern type. Alternatively, a match can be assessed based on whether the instantiation type is dissimilar to the pattern type. Stated differently, the type does not contain any of the features and/or properties provided by the pattern type. Additionally, a combination of the match methods (e.g., similar, dissimilar, like, not like . . . ) can be employed in accordance with an aspect of the invention. Further yet, it should be appreciated that a match can be predicated on a plurality of pattern types associated with a single type, for example a union, intersection, or a combination of a myriad of pattern types. If there is not a match at 530, a signal indicative or an error can be produced and an error generated at 540. In particular, a compile time error can be generated. Subsequently, the process can terminate. Furthermore, if the pattern type and the instantiation type are deemed to match at 530 then the process can terminate without error.

FIG. 6 depicts a method 600 of programming a computer utilizing generic types. At 610, a generic type parameter can be provided in association with a generic type name or constructor to facilitate parametric polymorphism. The type parameter can be specified and identified by delimiting an alphanumeric character or phase with, for example, brackets such as "<" and ">." The type parameter acts as a placeholder for a declared or instantiation type that can be employed to instantiate the generic type or in other words produce a constructed type. At 620, at least one pattern type is identified and associated with the type parameter, the pattern type defining constraints on the type parameter. At 630, a relationship is specified between one or more pattern types and the type parameter. For example, a type parameter can be constrained such that the parameter is like or is similar to a single pattern type. In other words, the type parameter contains at least the features and/or properties of the pattern. Unions and/or intersections of more than one pattern type are also within the scope of this invention. For instance, a relationship can be specified where a type parameter is similar to pattern A and pattern B thereby constraining the type parameter to include at least the properties and/or features of both pattern A and pattern B. Additionally or alternatively, a relationship can be specified where a type parameter is like pattern A or pattern B, thereby constraining the type parameter to types that contain at least features and/or properties provided by both pattern A and pattern B. The relationship that is specified at 630 is not limited to similarities. A relationship between a type parameter and a pattern type can also be expressed as dissimilarities. For instance, type parameter can be specified as unlike or dissimilar to one or more patterns such that the type parameter does not contain the features and/or properties of one or more identified patterns. At 640, the body of the generic type can be specified. The body can include among other things variables, declarations, and programmatic statements. Finally, at 650 the generic type can be instantiated with one or more types, the types being constrained by one or more pattern types associated with the type parameter.

FIG. 7 depicts a method 700 of interacting with generic types. In particular, the method 700 concerns modification of constraints associated with generic types. At 710, a pattern type is received or retrieved. A pattern type provides a mechanism for centrally locating a set of one or more type parameter constraints. According to one aspect of the invention, a pattern type can be specified as a programmatic class. At 720, the pattern type can be altered. More specifically, the pattern type class can be modified to add or eliminate properties and/or features thereof. For example, a pattern class can be amended to support compare operations (e.g., implement Icomparable interface) and/or provide a copy constructor. Once the pattern type has been amended as desired, the altered pattern type can be saved at 730, for instance, replacing the original pattern. In particular, the pattern type can be saved to a type definitions system storing generic type definitions as well as other classes. It should also be appreciated that new pattern types can be specified and saved by a similar methodology rather than simply amending current pattern types. Furthermore, pattern types can be deleted and replaced with new or different pattern types. The methodology described above is a new and efficient method of altering generic type constraints. In this manner, an entire runtime or execution engine (e.g., CLR, JVM . . . ) does not have to be redesigned and rebuilt to alter and provide support for new or different constraints. Rather, the execution engine can simply support pattern matching of provided pattern types to type parameters, the pattern types being defined and easily modified as a class, for instance.

Figure 8:
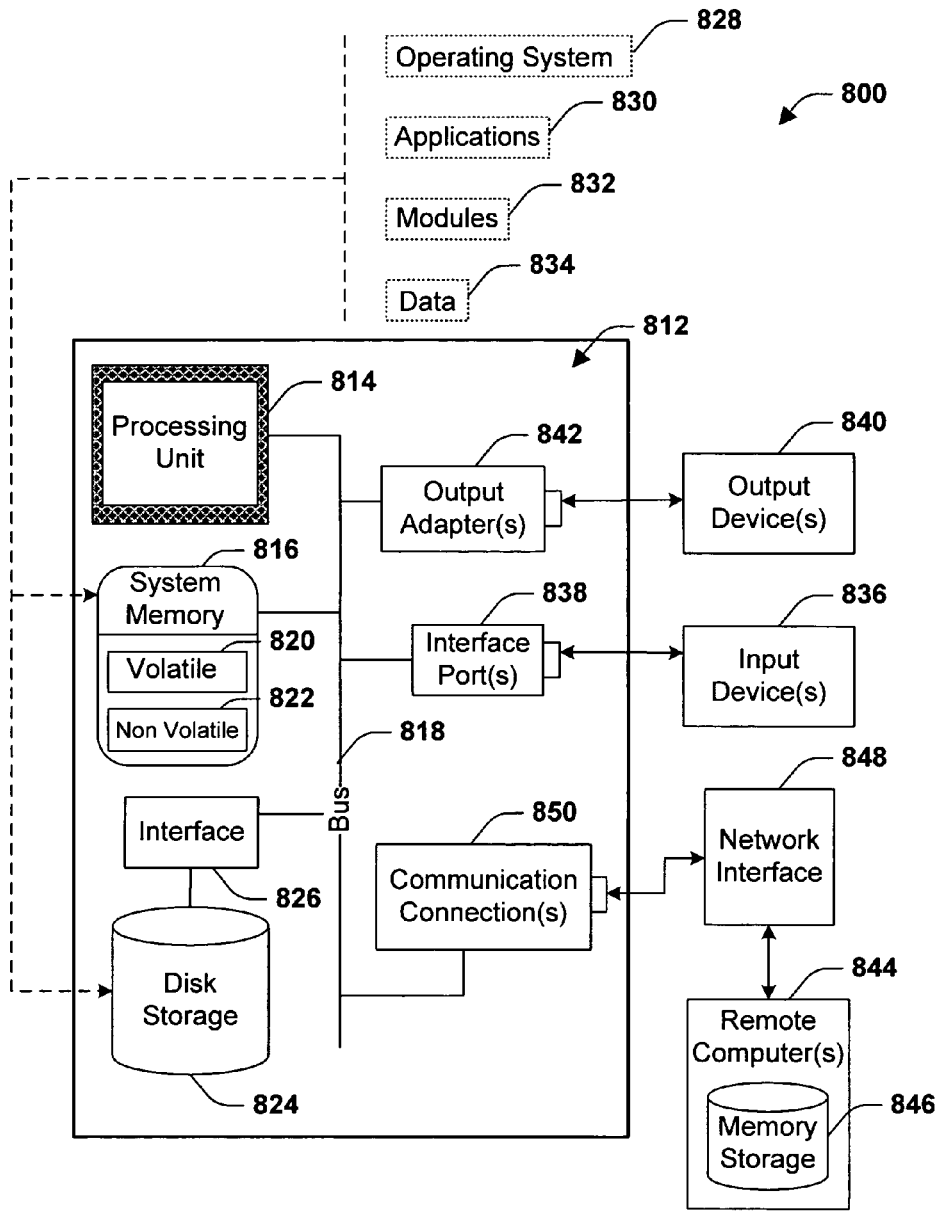
FIG. 8 is a schematic block diagram illustrating a suitable operating environment in accordance with an aspect of the present invention.
Figure 9:
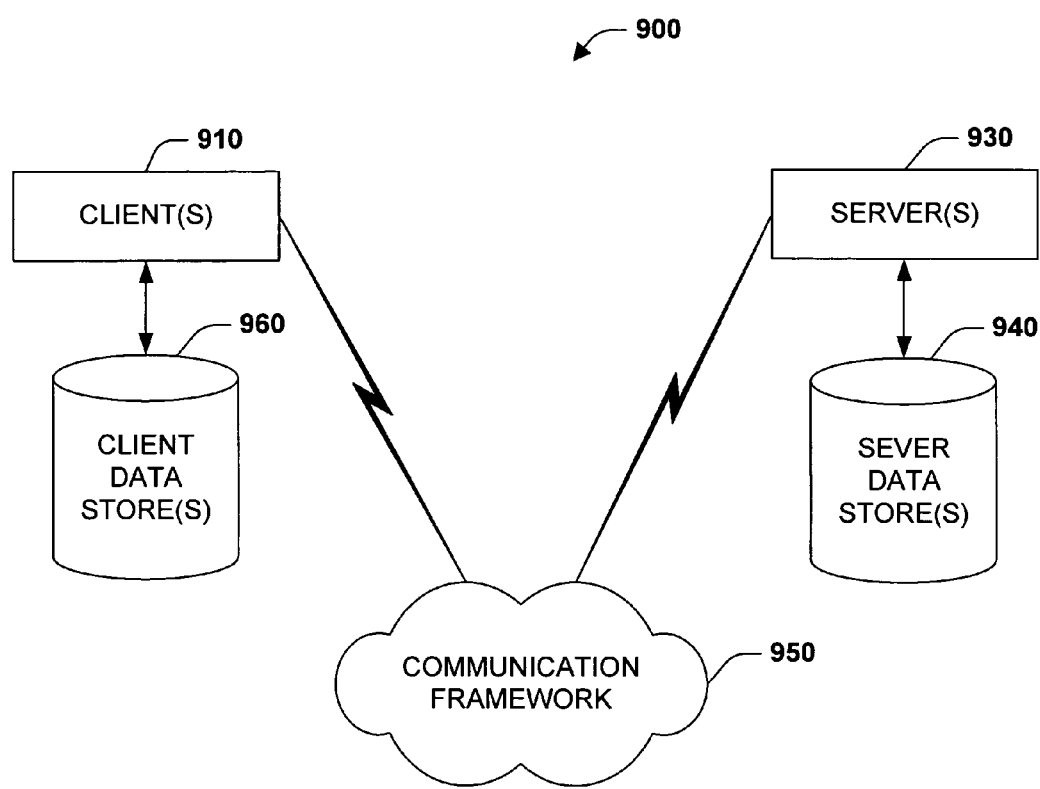
FIG. 9 is a schematic block diagram of a sample-computing environment with which the present invention can interact.

In order to provide a context for the various aspects of the invention, FIGS. 8 and 9 as well as the following discussion are intended to provide a brief, general description of a suitable computing environment in which the various aspects of the present invention may be implemented. While the invention has been described above in the general context of computer-executable instructions of a computer program that runs on a computer and/or computers, those skilled in the art will recognize that the invention also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the invention may also be practiced in distributed computing environments where task are performed by remote processing devices that are linked through a communications network. However, some, if not all aspects of the invention can be practiced on stand-alone computers. In a distributed computing environment, program modules may be located in both local and remote memory storage devices.

With reference to FIG. 8, an exemplary environment 800 for implementing various aspects of the invention includes a computer 812. The computer 812 includes a processing unit 814, a system memory 816, and a system bus 818. The system bus 818 couples system components including, but not limited to, the system memory 816 to the processing unit 814. The processing unit 814 can be any of various available processors. Dual microprocessors and other multiprocessor architectures also can be employed as the processing unit 814.

The system bus 818 can be any of several types of bus structure(s) including the memory bus or memory controller, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCM-CIA), and Small Computer Systems Interface (SCSI).

The system memory 816 includes volatile memory 820 and nonvolatile memory 822. The basic input/output system (BIOS), containing the basic routines to transfer information between elements within the computer 812, such as during start-up, is stored in nonvolatile memory 822. By way of illustration, and not limitation, nonvolatile memory 822 can include read only memory (ROM), programmable ROM (PROM), electrically programmable ROM (EPROM), electrically erasable ROM (EEPROM), or flash memory. Volatile memory 820 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 812 also includes removable/non-removable, volatile/non-volatile computer storage media. FIG. 8 illustrates, for example disk storage 824. Disk storage 824 includes, but is not limited to, devices like a magnetic disk drive, floppy disk drive, tape drive, Jaz drive, Zip drive, LS-100 drive, flash memory card, or memory stick. In addition, disk storage 824 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 824 to the system bus 818, a removable or non-removable interface is typically used such as interface 826.

It is to be appreciated that FIG. 8 describes software that acts as an intermediary between users and the basic computer resources described in suitable operating environment 810. Such software includes an operating system 828. Operating system 828, which can be stored on disk storage 824, acts to control and allocate resources of the computer system 812. System applications 830 take advantage of the management of resources by operating system 828 through program modules 832 and program data 834 stored either in system memory 816 or on disk storage 824. It is to be appreciated that the present invention can be implemented with various operating systems or combinations of operating systems.

A user enters commands or information into the computer 812 through input device(s) 836. Input devices 836 include, but are not limited to, a pointing device such as a mouse, trackball, stylus, touch pad, and keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port may be used to provide input to computer 812 and to output information from computer 812 to an output device 840. Output adapter 842 is provided in part to illustrate that there are some output devices 840 like displays (e.g., flat panel and CRT), speakers, and printers, among other output devices 840, which require special adapters. The output adapters 842 include, by way of illustration and not limitation, video and sound cards that provide a means of connection between the output device 840 and the system bus 818. It should be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a personal computer, a server, a router, a network PC, a workstation, a microprocessor based appliance, a peer device or other common network node and the like, and typically includes many or all of the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit-switching networks like Integrated Services Digital Networks (ISDN) and variations thereon, packet switching networks, and Digital Subscriber Lines (DSL).

Communication connection(s) 850 refers to the hardware/software employed to connect the network interface 848 to the bus 818. While communication connection 850 is shown for illustrative clarity inside computer 812, it can also be external to computer 812. The hardware/software necessary for connection to the network interface 848 includes, for exemplary purposes only, internal and external technologies such as, modems including regular telephone grade modems, cable modems, power modems and DSL modems, ISDN adapters, and Ethernet cards.

FIG. 9 is a schematic block diagram of a sample-computing environment 900 with which the present invention can interact. The system 900 includes one or more client(s) 910. The client(s) 910 can be hardware and/or software (e.g., threads, processes, computing devices). The system 900 also includes one or more server(s) 930. The server(s) 930 can also be hardware and/or software (e.g., threads, processes, computing devices). The servers 930 can house threads to perform transformations by employing the present invention, for example. One possible communication between a client 910 and a server 930 may be in the form of a data packet adapted to be transmitted between two or more computer processes. The system 900 includes a communication framework 950 that can be employed to facilitate communications between the client(s) 910 and the server(s) 930. The client(s) 910 are operably connected to one or more client data store(s) 960 that can be employed to store information local to the client(s) 910. Similarly, the server(s) 930 are operably connected to one or more server data store(s) 940 that can be employed to store information local to the servers 930.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A generic type parameter constraint system embodied on a computer readable storage medium comprising:
   a processor;
   a memory communicatively coupled to the processor, the memory having stored therein computer-executable instructions to implement the system, including:
      a generic type parameter component that receives at least one generic type declaration that instantiates a generic type, wherein the at least one generic type declaration includes:
         a type identifier that uniquely identifies the generic type;
         a type parameter that is a placeholder for one or more instantiation types that are assigned at instantiation;
         one or more pattern types that define a set of one or more constraints on the one or more instantiation types of the type parameter; and
         one or more keywords that define a plurality of different types of comparisons to utilize to determine whether the one or more constraints have been satisfied, wherein the plurality of different comparison types comprises using multiple instantiation types, multiple pattern types and a plurality of different relationships between the instantiation types and pattern types; and
      a comparison component that determines conformity of instantiation of the generic type by the generic type declaration based upon examining whether assignment of the one or more instantiation types to the type parameter satisfies the one or more constraints defined by the one or more pattern types based on the plurality of different comparison types defined by the one or more keywords, wherein the comparison component generates an error upon the one or more instantiation types not satisfying the one or more constraints defined by the one or more pattern types based on the plurality of different comparison types defined by the one or more keywords, wherein the generic type and the pattern type are defined as types in a type system.

2. The system of claim 1, wherein the one or more keywords defines a comparison of whether the one or more instantiation types is similar to the one or more pattern types.

3. The system of claim 2, wherein the one or more keywords defines a comparison of whether the one or more instantiation types includes at least the constraints defined by the one or more pattern types.

4. The system of claim 1, wherein the one or more keywords defines a comparison of whether the one or more instantiation types is dissimilar to the one or more pattern types.

5. The system of claim 4, wherein the one or more keywords defines a comparison of whether the one or more instantiation types excludes all of the constraints defined by the one or more pattern types.

6. The system of claim 1, wherein the one or more keywords defines a comparison of whether the one or more instantiation types includes at least the constraints defined by a union of a plurality of the one or more pattern types, wherein the union of the plurality of pattern types is specified as the constraint on the one or more instantiation types such that the type includes all the constraints specified by all of the pattern types of the union.

7. The system of claim 1, wherein the one or more keywords defines a comparison of whether the one or more instantiation type includes at least the constraints defined by an intersection of a plurality of the one or more pattern types, wherein the one or more instantiation types are satisfactory only if they include all the constraints in common with the plurality of pattern types.

8. The system of claim 1, wherein the one or more keywords defines a comparison of whether the one or more instantiation types includes at least the constraints of at least one pattern type and excludes the constraints of at least one other pattern type.

9. The system of claim 1, wherein the one or more keywords include at least one of "is similar to," "is like," "is dissimilar to" or "is not like."

10. The system of claim 1, wherein modifications to the one or more pattern types alters the constraints without the need to redesign and reconstruct an associated execution engine.

11. The system of claim 1, wherein the error is a compile-time error.

12. A type checking system embodied on a computer readable storage medium for generic types comprising:
   a processor;
   a memory communicatively coupled to the processor, the memory having stored therein computer-executable instructions to implement the system, including:
      means for retrieving a generic type declaration utilized to instantiate a generic type, wherein the generic type declaration includes:
         a type identification that uniquely identifies the generic type;
         a generic type parameter that represents an instantiation type that is assigned at instantiation;
         a plurality of pattern types that define a set of constraints on the instantiation type of the generic type parameter; and
         one or more keywords that define a plurality of different types of comparisons to utilize to determine whether the one or more constraints have been satisfied, wherein the plurality of different comparison types comprises using multiple instantiation types, multiple pattern types and a plurality of different relationships between the instantiation types and pattern types; and
      means for comparing the instantiation type to the pattern type and generating a compile-time error when the instantiation type fails to satisfy the constraints based upon the plurality of different comparison types, wherein the plurality of different comparison types includes a union of the plurality of the pattern types, wherein the union of the plurality of pattern types is specified as the constraint on the one or more instantiation types such that the type includes all the constraints specified by all of the pattern types of the union.

13. The system of claim 12, wherein the type and the pattern types are specified as types supported by an associated type system.

14. A method of type checking generic type parameters comprising:
employing a processor executing computer executable instructions embodied on at least one of a system memory or a computer storage media to perform the following acts:
receiving a generic type declaration for instantiating a generic type component, wherein the generic type component includes:
a type identification component that uniquely identifies the generic type;
a parameter identification component that is a placeholder for an instantiation type that is assigned to the generic type at instantiation;
one or more pattern type components that define a set of one or more constraints on the instantiation type of the parameter identification component; and
one or more keywords that define a plurality of different types of comparisons to utilize to determine whether the one or more constraints have been satisfied, wherein the plurality of different comparison types comprises using multiple instantiation types, multiple pattern types and a plurality of different relationships between the instantiation types and pattern types;
comparing instantiation of the generic type by the generic type declaration by examining whether assignment of the instantiation type to the generic type satisfies the one or more constraints defined by the one or more pattern type components based on the plurality of different comparison types defined by the one or more keywords;
producing an error indication when assignment of the instantiation type to the generic type does not satisfy the one or more constraints defined by the one or more pattern type components based on the plurality of different comparison types defined by the one or more keywords.

15. The method of claim 14, wherein comparing includes determining whether the instantiation type is similar to the one or more pattern type components, the parameter being similar when it includes at least the constraints of the one or more pattern type components.

16. The method of claim 14, wherein comparing includes determining whether the instantiation type is distinct from the one or more pattern type components, the instantiation type being distinct when it does not include any of the constraints specified by the one or more pattern type components.

17. The method of claim 14, wherein comparing includes determining whether the instantiation type includes at least the constraints of a first pattern type component and excludes the constraints of a second pattern type component.

18. The method of claim 14, wherein a pattern type component is defined by one of a class, an interface, a delegate or a struct.

19. The method of claim 18, wherein the instantiation type is defined by one of a class, an interface, a delegate or a struct.

20. The method of claim 14, wherein the error indication is a compile-time error.

21. A method of programming a computer utilizing generic types comprising:
employing a processor executing computer executable instructions embodied on at least one of a system memory or a computer storage media to perform the following acts:
providing a generic type declaration for a generic type component, wherein the generic type component includes:
a type identification component that uniquely identifies the generic type;
a parameter identification component that is a placeholder for an instantiation type that is assigned to the generic type at instantiation;
one or more pattern type components that define a set of properties that constrain the instantiation type of the parameter identification component; and
one or more keywords that define a type of comparison plurality of different types of comparisons to utilize to determine whether the one or more constraints have been satisfied, wherein the plurality of different comparison types comprises using multiple instantiation types, multiple pattern types and a plurality of different relationships between the instantiation types and pattern types.

22. The method of claim 21, wherein the one or more keywords that defines a type of comparison indicating that the instantiation type must be similar to the properties of the one or more pattern type components.

23. The method of claim 21, wherein the one or more keywords that defines a type of comparison indicating that the instantiation type must include at least the properties of all of the one or more pattern type components.

24. The method of claim 21, wherein the one or more keywords that defines a type of comparison indicating that the instantiation type must be dissimilar to the union of properties of two or more pattern type components.

25. The method of claim 21, wherein the type parameter one or more keywords that defines a type of comparison indicating that the instantiation type must be dissimilar to the set of properties.

26. The method of claim 21, further comprising instantiating the generic type based upon the generic type declaration.

27. A method of employing generic type constraints comprising:
employing a processor executing computer executable instructions embodied on at least one of a system memory or a computer storage media to perform the following acts:
receiving a generic type declaration for instantiating a generic type component, wherein the generic type component includes:
a type identification component that uniquely identifies the generic type;
a parameter identification component that is a placeholder for an instantiation type that is assigned to the generic type at instantiation;
one or more pattern type components that define a set of one or more constraints on the instantiation type of the parameter identification component; and
one or more keywords that define a plurality of different types of comparisons to utilize to determine whether the one or more constraints have been satisfied, wherein the plurality of different comparison types comprises using multiple instantiation types, multiple pattern types and a plurality of different relationships between the instantiation types and pattern types, the one or more keywords defines one of a comparison indicating that the one or more instantiation types includes at least the constraints defined by a union of a plurality of the one or more pattern type components or a comparison indicating that the one or more instantiation types includes at least the constraints defined by an intersection of a plurality of the one or more pattern type components;

comparing instantiation of the generic type by the generic type declaration by examining whether assignment of the instantiation type to the generic type satisfies the one or more constraints defined by the one or more pattern type components based on the plurality of different comparison types defined by the one or more keywords;

generating an error signal when assignment of the instantiation type to the generic type does not satisfy the one or more constraints defined by the one or more pattern type components based on plurality of different comparison types defined by the one or more keywords.

\* \* \* \* \*